United States Patent
Erickson et al.

(10) Patent No.: US 7,934,665 B2
(45) Date of Patent: May 3, 2011

(54) ULTRASONIC SPRAY COATING SYSTEM

(75) Inventors: Stuart J. Erickson, Marblehead, MA (US); Drew D. Erickson, West Newbury, MA (US); Wesley O. Davis, Plaistow, NH (US); Christopher J. Cote, Amesbury, MA (US); Norman R. Faucher, Londonderry, MA (US)

(73) Assignee: Ultrasonic Systems Inc., Haverhill, MA (US)

( * ) Notice: Subject to any disclaimer, the term of this patent is extended or adjusted under 35 U.S.C. 154(b) by 481 days.

(21) Appl. No.: 12/045,789

(22) Filed: Mar. 11, 2008

(65) Prior Publication Data
US 2008/0314314 A1    Dec. 25, 2008

Related U.S. Application Data

(63) Continuation-in-part of application No. 10/927,547, filed on Aug. 26, 2004, now abandoned.

(51) Int. Cl.
*B05B 1/08* (2006.01)
*B05B 3/04* (2006.01)

(52) U.S. Cl. .......... 239/102.2; 239/102.1; 239/292; 239/300; 118/313

(58) Field of Classification Search .......... 239/102.1, 239/102.2, 290, 291, 292, 300; 604/22; 118/313
See application file for complete search history.

(56) References Cited

U.S. PATENT DOCUMENTS

| | | |
|---|---|---|
| 3,103,310 A | 9/1963 | Lang |
| 4,085,893 A | 4/1978 | Durley, III |
| 4,521,462 A * | 6/1985 | Smythe .......... 427/156 |
| 4,601,921 A | 7/1986 | Lee |
| 4,930,700 A | 6/1990 | McKown |
| 5,104,042 A * | 4/1992 | McKown .......... 239/102.2 |
| 5,186,389 A | 2/1993 | Shibano |
| 5,409,163 A * | 4/1995 | Erickson et al. .......... 239/4 |
| 5,540,384 A | 7/1996 | Erickson et al. |
| 5,582,348 A | 12/1996 | Erickson et al. |
| 5,622,752 A | 4/1997 | Erickson et al. |
| 6,102,298 A * | 8/2000 | Bush et al. .......... 239/4 |
| 6,478,754 B1 | 11/2002 | Babaev |
| 6,623,444 B2 * | 9/2003 | Babaev .......... 604/22 |
| 6,663,554 B2 | 12/2003 | Babaev |

OTHER PUBLICATIONS

Office Action issued Nov. 15, 2010, in related U.S. Appl. No. 12/626,966.

* cited by examiner

*Primary Examiner* — Dinh Q Nguyen

(57) ABSTRACT

Disclosed is an ultrasonic spray coating system comprising an ultrasonic spray head with integrated fluid delivery system (IFDS), which consists of an ultrasonic transducer with a spray forming tip, an ultrasonic generator, an external liquid applicator, a precision liquid delivery system and air directors. The coating liquid is delivered to the spray forming tip on the ultrasonic transducer from an external liquid applicator. The liquid is stored in a pressurized reservoir and fed to the liquid applicator by a precision liquid delivery system. The ultrasonic vibrations of the spray forming tip break up the liquid into small droplets and propel them from the tip in the form of a spray. The spray produced with ultrasonic energy alone is a very narrow "sheet-like" pattern. The width of the spray pattern produced is equal to the width of the spray forming tip (2 mm to 4 mm). Air directors are used to produce air streams to further shape and accelerate the ultrasonically produced spray. Air directors can be used to produce three distinct spray patterns, based upon the nature and placement of the air stream—narrow mode spray pattern; wide mode spray pattern; or side mode spray pattern.

22 Claims, 18 Drawing Sheets

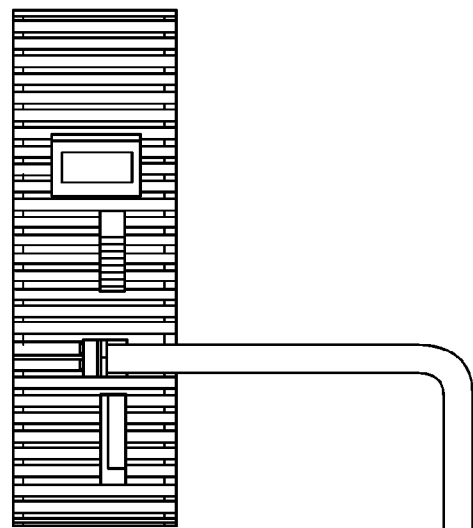
ULTRASONIC POWER GENERATOR
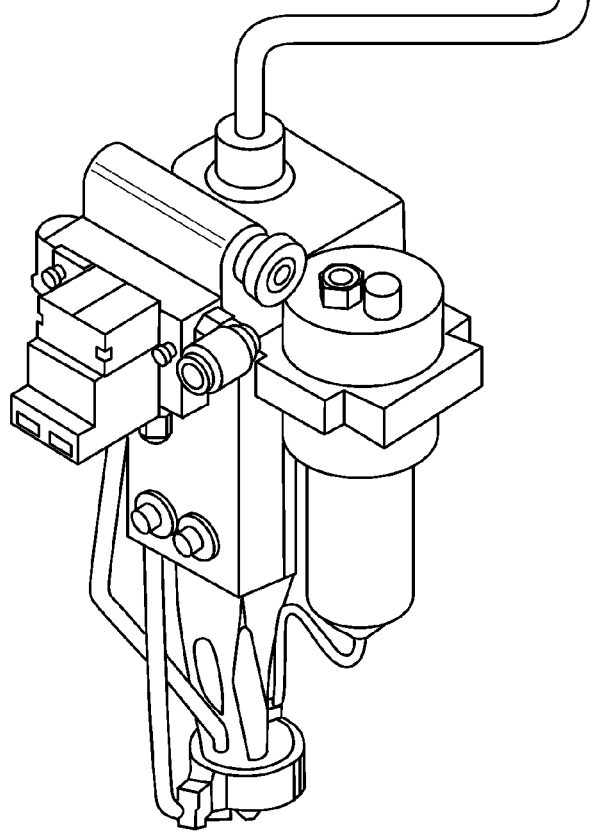
ULTRASONIC SPRAY HEAD
FIG. 1A

| ITEM | QTY | DESCRIPTION |
|---|---|---|
| 1 | 1 | ULTRASONIC TRANSDUCER |
| 2 | 1 | MICRO FLOW CONTROL VALVE |
| 3 | 1 | AIR FLOW CONTROL VALVE |
| 4 | 1 | LIQUID FEED TUBE |
| 5 | 1 | INTEGRATED FLUIDS APPLICATOR |
| 6 | 1 | SPRAY HEAD MOUNTING BRACKET |
| 7 | 1 | MOUNTING THUMB SCREW |
| 8 | 1 | FLUIDS APPLICATOR MOUNTING BRACKET |
| 9 | 1 | CAM ADJUSTER |
| 10 | 1 | MICRO FLOW CONTROL BRACKET |
| 11 | 1 | FILTER BRACKET |
| 12 | 1 | FLUID FILTER |
| 13 | 1 | LIQUID SUPPLY TUBE |

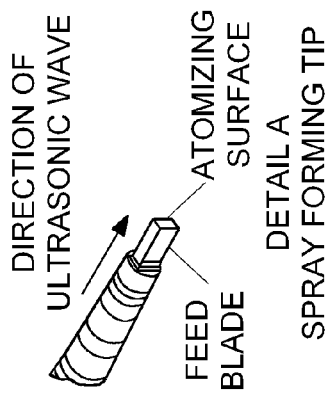
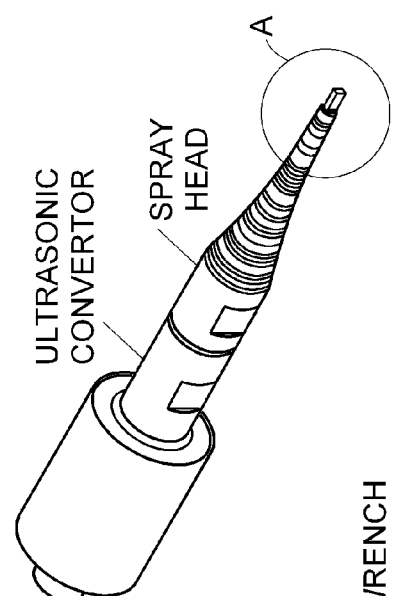
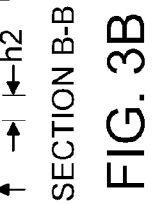
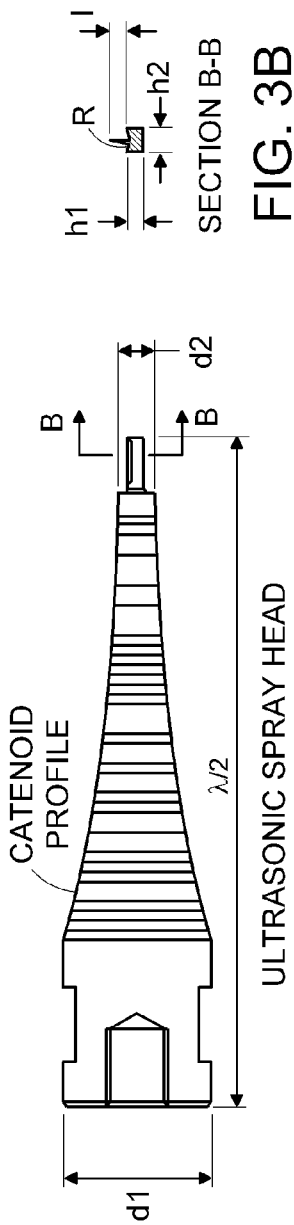
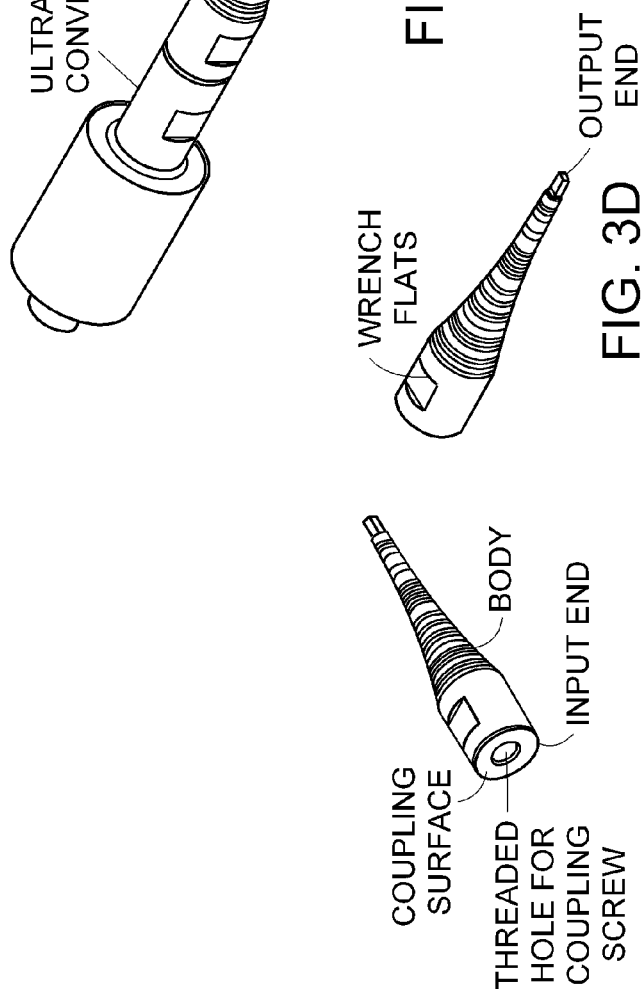
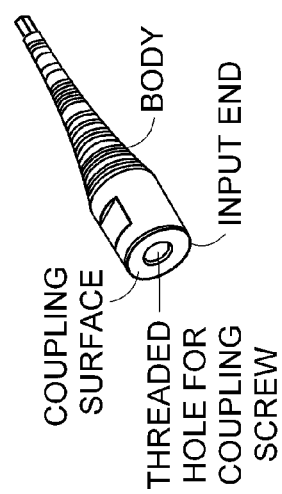

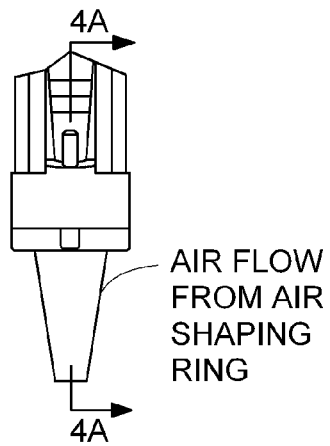
FIG. 4E
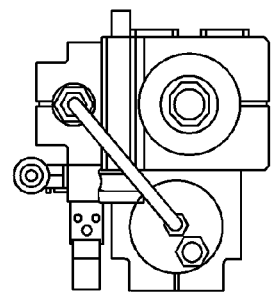
FIG. 4D
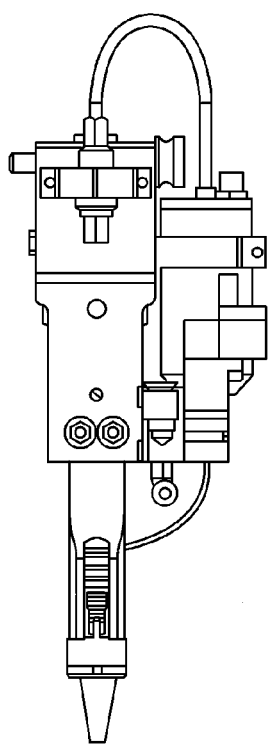
FIG. 4C
FIG. 4B
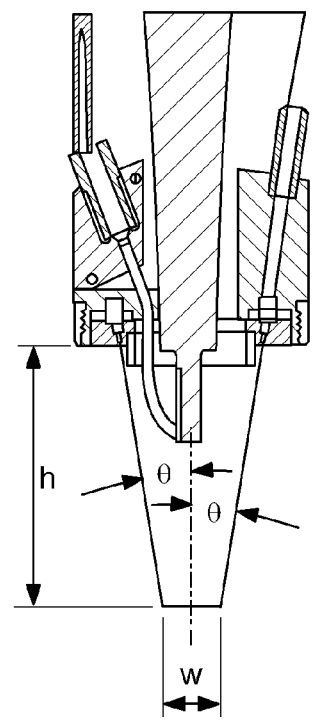
FIG. 4A

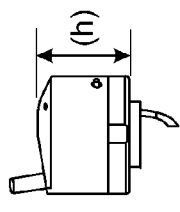
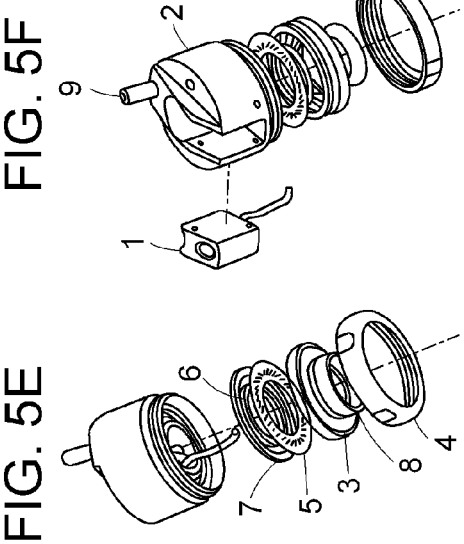
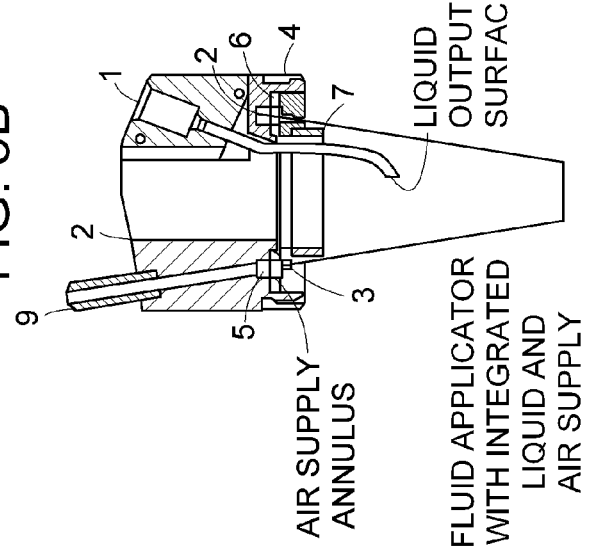
FIG. 5A — FLUID APPLICATOR WITH INTEGRATED LIQUID AND AIR SUPPLY
FIG. 5B
FIG. 5C
FIG. 5D
FIG. 5E
FIG. 5F
FIG. 5G
| ITEM | DESCRIPTION |
|---|---|
| 1 | LIQUID APPLICATOR |
| 2 | FLUIDS APPLICATOR BODY |
| 3 | AIR SHAPING RING |
| 4 | AIR SHAPING RING RETAINER |
| 5 | AIR DIFFUSER |
| 6 | INNER GASKET |
| 7 | OUTER GASKET |
| 8 | AIR SHROUD |
| 9 | AIR INLET |

| ITEM | DESCRIPTION |
|---|---|
| 1 | LIQUID APPLICATOR |
| 2 | AIR DIRECTOR ASSEMBLY |
| 3 | FLUIDS APPLICATOR BODY |
| 4 | AIR SHAPING RING |
| 5 | AIR SHAPING RING RETAINER |
| 6 | AIR DIFFUSER |
| 7 | INNER GASKET |
| 8 | OUTER GASKET |
| 9 | AIR SHROUD |
| 11 | AIR INLET |
| 12 | LIQUID APPLICATOR BLOCK |
| 13 | LIQUID FEED TUBE |
| 14 | LIQUID INLET PORT |
| 15 | WIDE MODE AIR DIRECTOR INLET PORT |
| 16 | WIDE MODE AIR DIRECTOR TUBE |
| 17 | LIQUID OUTLET PORT |

| ITEM | DESCRIPTION |
|---|---|
| 1 | AIR DIRECTOR ASSEMBLY |
| 2 | FLUIDS APPLICATOR ASSEMBLY |

| ITEM | DESCRIPTION |
|---|---|
| 1 | AIR DIRECTOR TUBE |
| 2 | AIR DIRECTOR |
| 3 | AIR DIRECTOR CLAMP |

| ITEM | DESCRIPTION |
|---|---|
| 1 | LIQUID APPLICATOR |
| 3 | FLUIDS APPLICATOR BODY |
| 4 | AIR SHAPING RING |
| 5 | AIR SHAPING RING RETAINER |
| 6 | AIR DIFFUSER |
| 7 | INNER GASKET |
| 8 | OUTER GASKET |
| 9 | AIR SHROUD |
| 11 | AIR INLET |
| 12 | LIQUID APPLICATOR BLOCK |

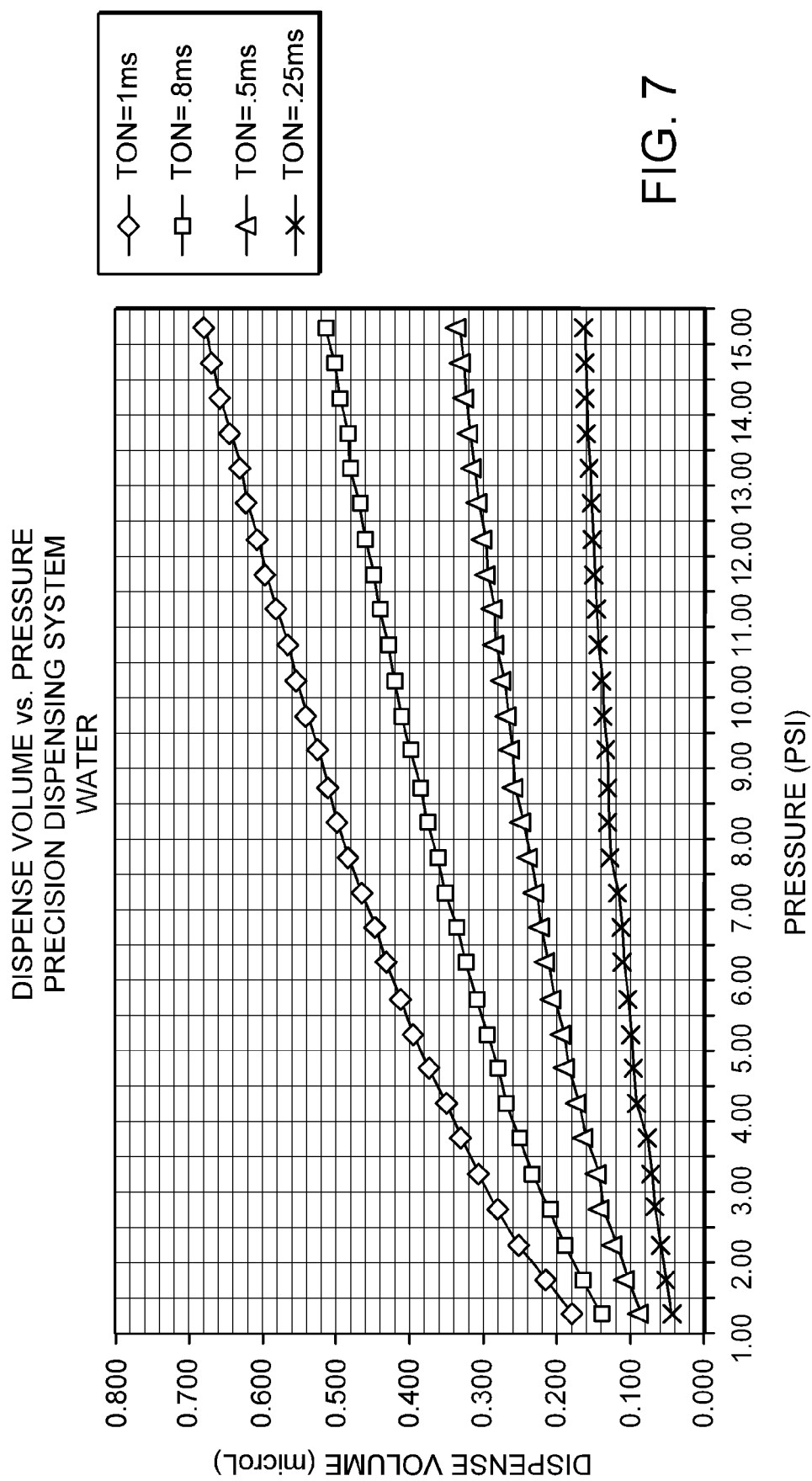

ULTRA-SPRAY CAT 35 ILDS HEAD
NOMINAL SPRAY PATTERN

ULTRASONIC SPRAY COATING SYSTEM

CROSS-REFERENCE TO RELATED APPLICATIONS

This application is a continuation-in-part of commonly owned U.S. application Ser. No. 10/927,547, filed Aug. 26, 2004. The '547 application is a continuation-in-part of PCT Application No. PCT/US2004/009549 filed 29 Mar. 2004, which designates the United States. The PCT Application claims priority from commonly owned, U.S. Provisional Application Ser. No. 60/458,487, filed 28 Mar. 2003. The disclosures of these applications are hereby incorporated herein by reference.

BACKGROUND OF THE INVENTION

The present invention provides an ultrasonic spray coating system that represents an improvement over the ultrasonic spray systems described in U.S. Pat. Nos. 5,409,163, 5,540,384, 5,582,348 and 5,622,752, the disclosures of which are hereby incorporated herein by reference. The ultrasonic spray coating system of the present invention can be used in the methods taught in these patents, and can also be used as described herein.

SUMMARY OF THE INVENTION

The ultrasonic spray head with integrated fluid delivery system (IFDS) consists of an ultrasonic transducer with a spray forming tip, an ultrasonic generator, an external liquid applicator, a precision liquid delivery system and air directors.

The coating liquid is delivered to the spray forming tip on the ultrasonic transducer from an external liquid applicator. The liquid is stored in a pressurized reservoir and fed to the liquid applicator by a precision liquid delivery system. The ultrasonic vibrations of the spray forming tip break up the liquid into small droplets and propel them from the tip in the form of a spray. The spray produced with ultrasonic energy alone is a very narrow "sheet-like" pattern. The width of the spray pattern produced is equal to the width of the spray forming tip (2 mm to 4 mm).

Air directors are used to produce air streams to further shape and accelerate the ultrasonically produced spray. Air directors can be used to produce three distinct spray patterns, based upon the nature and placement of the air stream—narrow mode spray pattern; wide mode spray pattern; or side mode spray pattern.

An air shaping ring in the IFDS assembly is used for the narrow mode spray pattern operation of the spray head. The air shaping ring entrains the ultrasonically produced spray without mixing with it and produces a coating segment about 5 mm wide with well-defined edges from a distance of about 25 mm between the spray head and the substrate.

An air director in the IFDS assembly is used to produce the wide mode spray pattern operation of the spray head. The air director impinges a jet of air on the tip of the spray head opposite the liquid feed side. The resulting airflow entrains and expands the ultrasonically produced spray to form a flat (rectilinear) pattern up to five times (5×) the width of the pattern produced by in the narrow mode. The width of the spray pattern is proportional to the distance between the spray head tip and the substrate.

An air director in the IFDS assembly is also used to produce the side mode spray pattern operation of the spray head. Here the air director impinges a jet of air on the tip of the spray head opposite the liquid feed side, and the spray head tip is offset to the side of the substrate so that the spray is directed to coat a vertical side of the substrate.

Since the spray is produced with ultrasonic energy rather than pressure and because a low velocity air stream is used only to shape or guide the spray pattern, the transfer efficiency is in the range of 95 to 99 percent. In other words, very little coating is wasted due to overspray. All process parameters for the spray head with the integrated fluid delivery system are controlled electronically, including liquid flow rate, air pressure, spray mode, head height and head speed.

The method used to deliver the coating liquid to the liquid applicator on the ultrasonic spray head is based upon the properties of the coating material. The coating material is stored in a sealed reservoir and then precisely metered to the liquid applicator. Liquid metering methods include pressurizing the coating reservoir; activating liquid flow with a solenoid valve and delivering the liquid to the applicator through a precision orifice; pressurizing the coating reservoir and delivering the liquid to the applicator with a rapidly pulsing solenoid valve; delivering the liquid to the applicator with a motorized positive displacement piston type pump; or the like.

BRIEF DESCRIPTION OF THE DRAWINGS

FIG. 1, which includes two parts (1A and 1B) the device of the present invention. FIG. 1A shows the ultrasonic power generator attached to the spray unit, with the ultrasonic spray head.

FIG. 4, which includes four parts (4A, 4B, 4C, 4D and 4E) illustrates the Air Shaping Ring of the Integrated Fluid Delivery System (IFDS) employed in the spray head of the present invention.

FIG. 5, which includes seven parts (5A, 5B, 5C, 5D, 5E, 5F and 5G) illustrates the Integrated Fluid Delivery System (IFDS) employed in the spray head of the present invention.

FIG. 7 is a graph illustrating dispense volume per pulse vs. pressure, illustrating the accurate flow control available in the spray head of the present invention.

DETAILED DESCRIPTION OF THE PREFERRED EMBODIMENTS

Figure 1B:
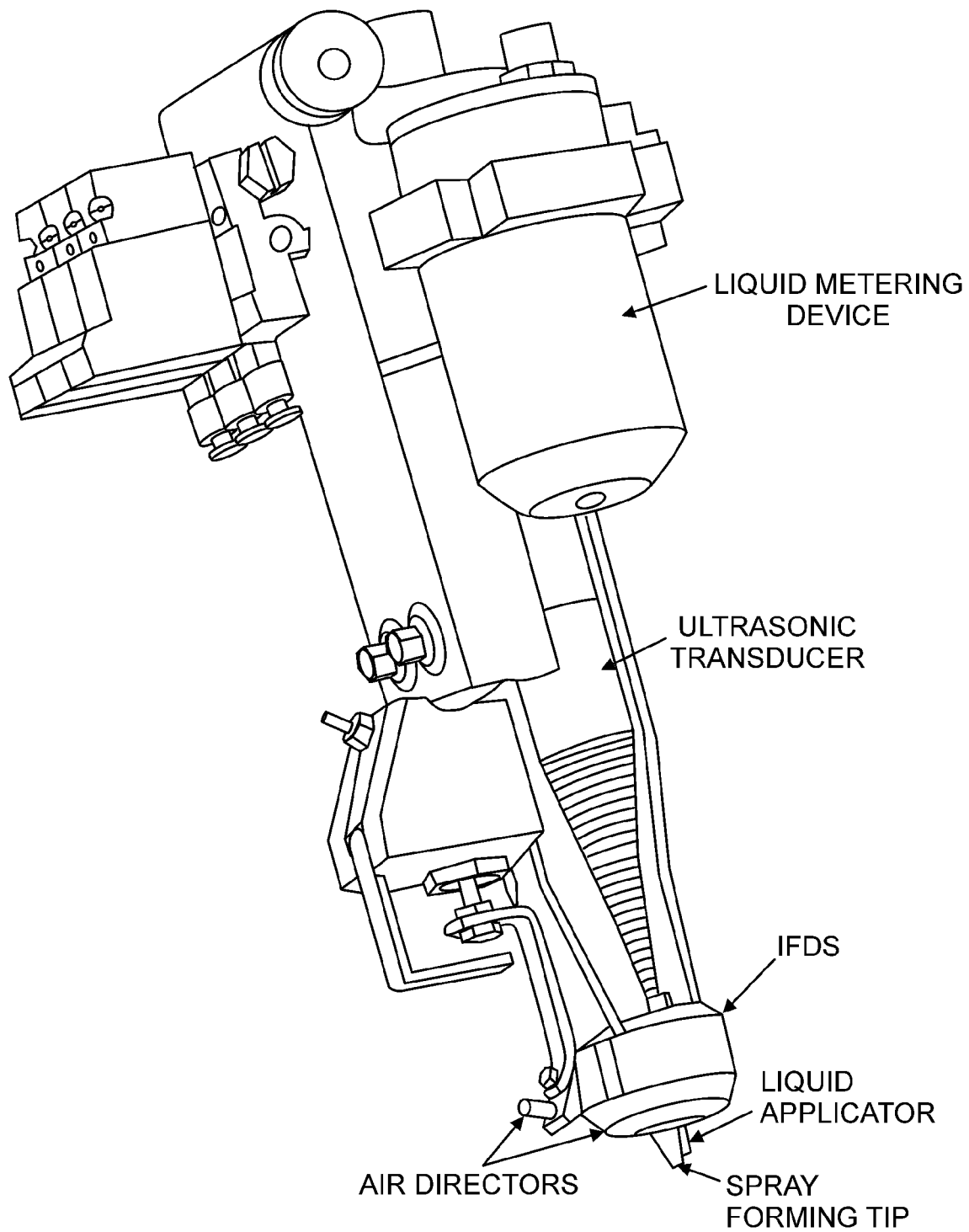
FIG. 1B shows additional details including the liquid metering device, ultrasonic transducer, IFDS, air directors, liquid applicator and the spray forming tip.
Figure 2:
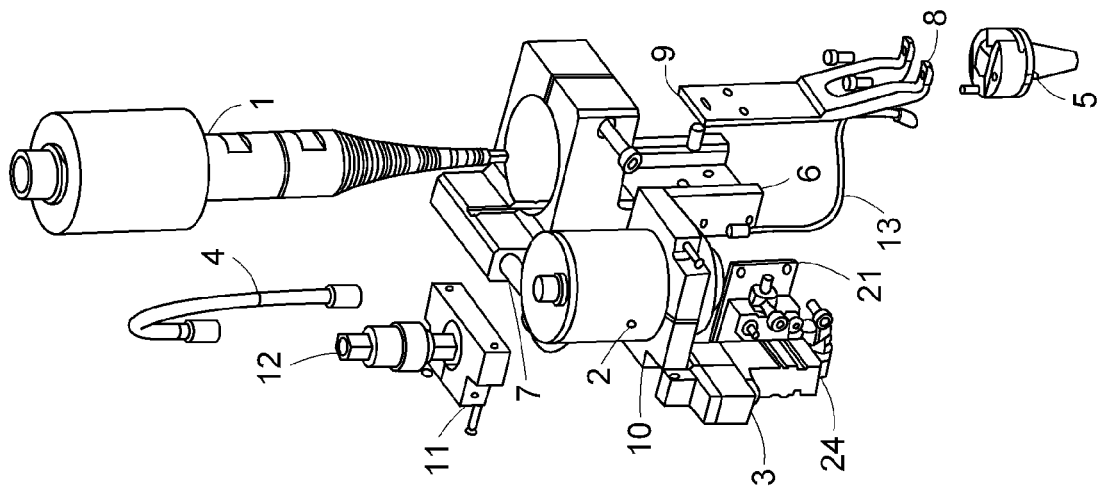
FIG. 2 is an exploded view of the component parts showing the relationships between the ultrasonic spray head with IFDS and the pulsed liquid delivery system of the present invention.

The present invention is an ultrasonic spray coating system comprising an ultrasonic converter with spray head, integrated fluid delivery device with air and liquid supply passage ways, support brackets and an ultrasonic power generator. See FIGS. 1A, 1B, 10, 11 and 12.

This invention preferably comprises an ultrasonic spray coating system with an integrated fluid applicator. In one preferred embodiment, the system is capable of spraying liquids onto substrates in narrow (2 mm to 5 mm wide), well-defined patterns at a distance of up to 1.75 inches from the substrate.

In addition to the directed air stream produced by the air-shaping ring to focus the spray the following additional embodiments have been made:
1) An air director and mounting ring.
2) A pneumatically actuated air director positioner for the air director.
3) Two additional solenoid valves to activate air flow to the air director and to the air director positioner.

These improvements enable the spray head to operate in any one of the following three-modes (or combinations thereof):
1) Narrow mode—where the airflow is directed through the air-shaping ring to focus the ultrasonically produced spray. See FIGS. 10 and 11.
2) Wide mode—where the airflow is directed through the air director to expand the ultrasonically produced spray. Impinging the directed air stream on the flat surface of the spray-forming tip expands the spray. The directed air stream is impinged on the opposite surface to the liquid feed surface. See FIGS. 10 and 12.
3) Side mode—where the air director positioner is actuated, moving the air director to the lower position and airflow is directed through the air director to direct the ultrasonically produced spray at an oblique angle from the spray forming tip. The purpose of directing the spray at an oblique angle is to coat a vertical surface, such as the side of a tall component that would not otherwise be coated if the spray were directed in the normal vertical path. See FIGS. 10 and 13.

In many coating applications, such as the application of conformal coatings to printed circuit boards, there are various size areas that require a uniform coating. Due to production volume, the time available to apply the coating may be limited. It is critical to have the ability to accurately apply coatings to small areas without applying coating to adjacent areas or components (keep out areas). This can be achieved with a narrow, focused spray pattern. However, if a larger area needs to be coated, many passes will be required with the narrow width spray. This may exceed time limitations imposed by production volume. A wider spray pattern will enable larger areas to be coated more quickly. Additionally, coating may need to be applied to the side surfaces of taller components. A spray applicator that is able to deliver a narrow pattern for small areas, a wider pattern for larger areas as well as the ability to apply coating to the side surfaces of taller components would meet these requirements.

Thus, the improved spray head of the present invention provides the following benefits:

1) The ability to apply a narrow coating pattern and a wider coating pattern with the same spray head.

2) The ability to apply a narrow coating pattern, a wider coating pattern and a sideways coating pattern with the same spray head.

3) The ability to change between the three modes of operation without manual adjustments. Pattern changes are initiated through the coating system software and control components.

4) The ability to expand the narrow coating pattern by a multiple of up to 5 times the narrow pattern width. For example, from a narrow pattern width of 5 mm, to a wide pattern width of 25 mm.

5) The ability to significantly reduce the time to coat a substrate with both small areas and large areas to be coated.

Referring in detail to FIGS. 1A and 1B, the ultrasonic converter transforms high frequency electrical energy into high frequency mechanical energy. The converter has a resonant frequency. A spray head is coupled to the converter and is resonant at the same resonant frequency of the converter. The spray head has a spray-forming tip and concentrates the vibrations of the converter at the spray-forming tip.

The integrated fluid applicator contains separate passageways for liquid and air, a liquid output surface, an air output annulus and an air-shaping ring. The fluid applicator has separate ports for air and liquid. The air inlet port is connected to a ring shaped annulus. The inlet port for liquid is connected to the output surface of the applicator. The air-shaping ring attaches to the bottom of the fluid applicator to enclose the air annulus to form an air passageway to supply air to the holes in the air-shaping ring. The angle of the holes in the air-shaping ring can be set to achieve a specific focal point of the liquid spray, thus producing the desired spray pattern size.

Referring in detail to FIGS. 2 and 3, the spraying end of the system contains the necessary elements to produce the desired spray pattern: 1) atomizing surface of the spray head, 2) liquid applicator output surface and 3) air shaping ring. These elements are arranged in a manner that allows spraying end to be contained within a small in area (less than 19 mm×18 mm). This small envelope allows the spray system to be positioned in tight areas for spray coating between objects protruding from the substrate (e.g., components attached to a printed wiring board).

Ultrasonic Spray Head with IFDS and Pulsed Liquid Delivery System

Referring in detail to FIG. 2, the ultrasonic spray head with IFDS and pulsed liquid delivery system has thirteen components:

1. Ultrasonic transducer/converter
2. Micro flow control valve
3. Air flow control valve
4. Liquid feed tube
5. Integrated fluid applicator
6. Spray head mounting bracket
7. Mounting thumb screw
8. Fluids applicator mounting bracket
9. Cam adjuster
10. Micro flow control bracket
11. Filter bracket
12. Fluid filter
13. Liquid spray tube The IFDS is fixed in position relative to the spray forming tip with a precision bracket system that allows the IFDS to be adjusted in the "Z" direction and the "X" direction. The mounting surface of the IFDS attaches to the fork shaped end of the IFDS bracket with two machine screws. The IFDS mounting holes in the bracket are slotted to allow the IFDS to be positioned in the "X" axis relative to the spray forming tip. The IFDS bracket attaches to the slots in the "tee" shaped leg of the spray head bracket with two machine screws and wave washers. The barrel of the adjuster cam mounts in a hole in the spray head bracket underneath the IFDS bracket. The slotted end of the adjuster cam protrudes from the backside of the tee leg to allow the cam to be rotated with a screwdriver. The eccentric pin portion of the adjuster cam mates with a slot in the IFDS bracket. When the cam adjuster is rotated the eccentric pin moves the IFDS bracket up and down to provide the "Z" adjustment of the IFDS relative to the spray forming tip.

The spray head is clamped in the spray head bracket. The spray head is "keyed" to the bracket to orient the spray forming tip to the IFDS.

Spray Head Description

Referring in detail to FIG. 3, the ultrasonic spray head is comprised of an input end, a body and a spray forming tip. The spray forming tip or output end contains a feed blade and an atomizing surface. The spray head has a resonant frequency (fsh) and has a length equal to one-half wavelength ($\lambda/2$) of the resonant frequency. The wavelength for a particular spray head is defined by:

$\lambda = Cm/fsh$

Where:
$\lambda$ = Wavelength (inches)
Cm = material's speed of sound (inches/second)
fsh = resonant frequency (Hertz or 1 cycle/second)

The practical resonant frequencies range from 20 kHz to 120 kHz for atomizing liquids (20 kHz $\leq$ fsh $\leq$ 120 kHz). The spray head is constructed of metal, either 6Al-4V titanium or 7075-T6 aluminum; titanium is preferred because of its strength and corrosion resistance properties.

The input end is comprised of a coupling surface and a coupling screw. The input end of the spray head is connected to an ultrasonic converter. The input must be flat and smooth for optimal mechanical coupling to the converter. The ultrasonic converter has a resonant frequency (fc) that is matched to the resonant frequency of the spray head (fsh) or fc=fsh.

The body connects the input end to the output end and is formed to concentrate ultrasonic vibrations on the output end. To achieve ultrasonic amplification through the body, the input end must be larger than the output end. The profile of the body can be stepped, linear, exponential or Catenoid. The Catenoid shape is preferred because it provides the largest amplification of the sound wave through the body to the output end, which in turn, provides maximum atomizing capability. Preferable ratios of output end diameter (d2) to input end diameter (d1) are:

$4 \geq (d1/d2) \leq 8$

The Catenoid shape is described by the catenoidal equation:

$Y = Yo * cosh [m(X - Xo)]$

Where:
    X→X coordinate
    Y→Y coordinate at X
    Xo→X coordinate of the lowest point on Catenoid
    Yo→Y coordinate of the lowers point on Catenoid
    Cosh→hyperbolic cosine
    M→Constant (depends on the end points of the catenoid)

The spray forming tip has two main features: 1) an atomizing surface that provides concentrated ultrasonic vibrations with sufficient energy to atomize a flowing liquid, 2) a feed blade that allows a liquid that is applied to it to flow to the atomizing surface.

The spray forming tip is preferably rectangular but it can be round or square. The shape of the spray forming tip influences the shape of the spray that forms on the atomizing surface. A round tip produces a more or less round spray, a square tip produces a more or less square spray and a rectangular tip produces a more or less rectangular spray.

The purpose of the feed blade is to direct all of the liquid flow towards and onto the atomizing surface. The feed blade shape can be convex (round), concave or flat. With a round or convex feed blade the liquid streams to the atomizing surface but some also flows around the spray forming tip before finally reaching the atomizing surface. The flat feed blade performs better with most of the liquid going to the atomizing surface, however some liquid still flows onto the sides of the feed blade before going to the atomizing surface. This spurious liquid flow causes the spray pattern to become erratic resulting in ragged, ill defined edges on the coating pattern.

Figure 3G:
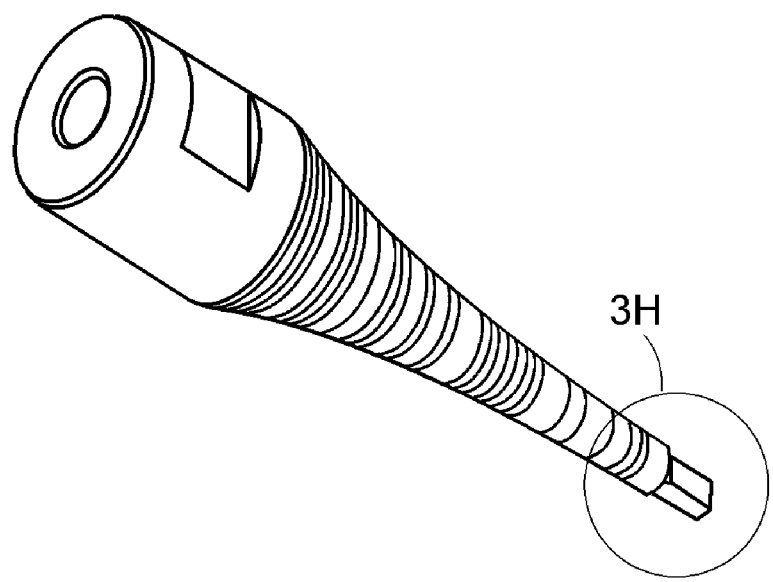
FIG. 3, which includes eight parts (3A, 3B, 3C, 3D, 3E, 3F, 3G and 3H) illustrates the spray head of the present invention.
Figure 3H:
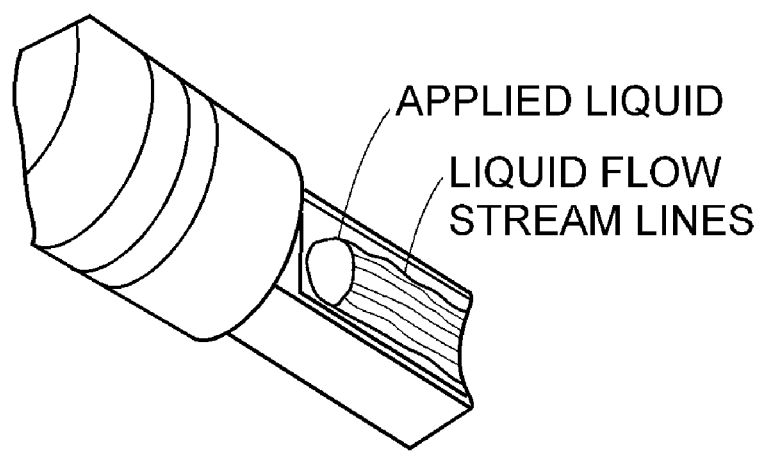
Figure 6A:
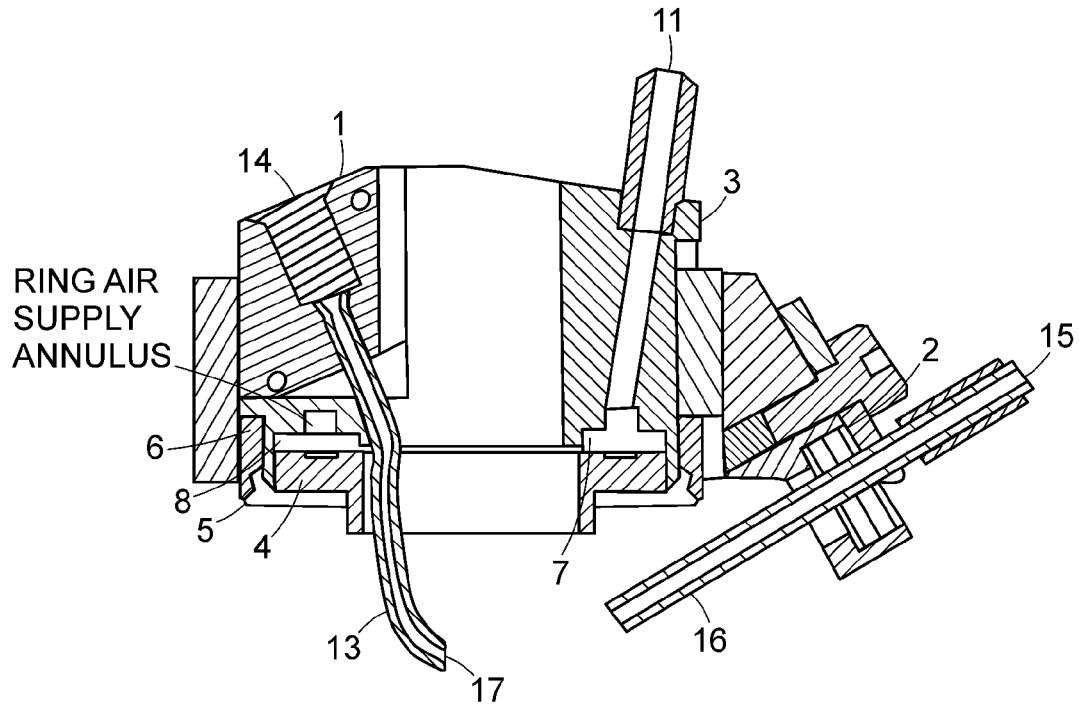
FIG. 6, which includes five parts (6A, 6B, 6C, 6D and 6E) illustrates details of the liquid applicator and the air director system.
Figure 6B:
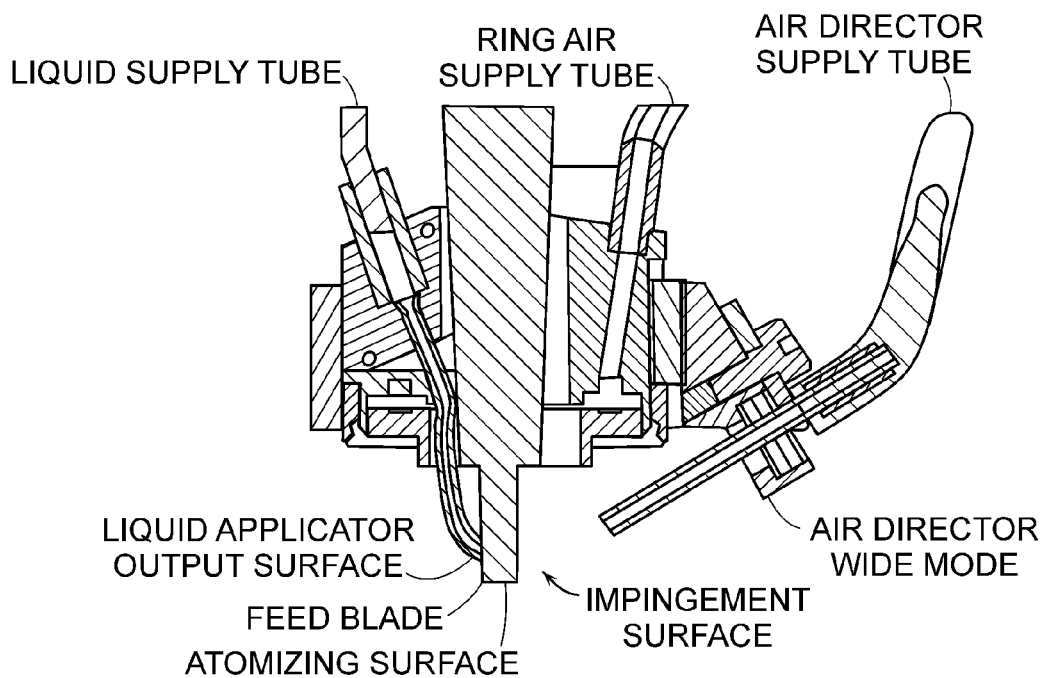
Figure 6C:
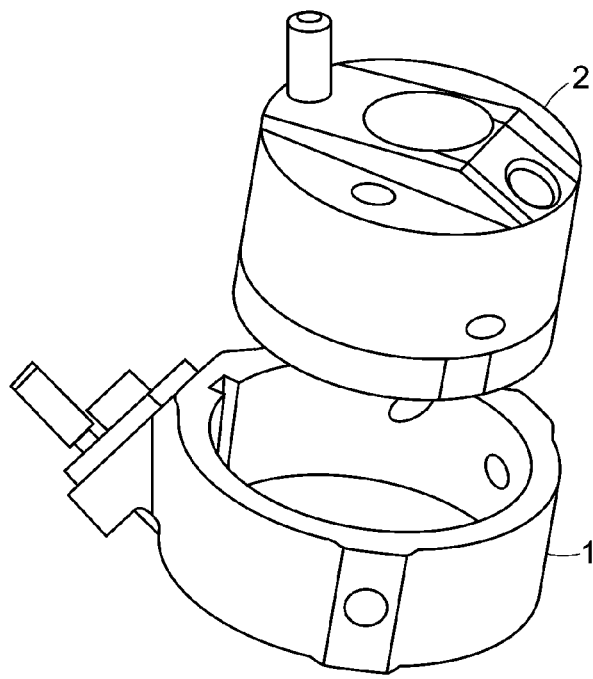
Figure 6D:
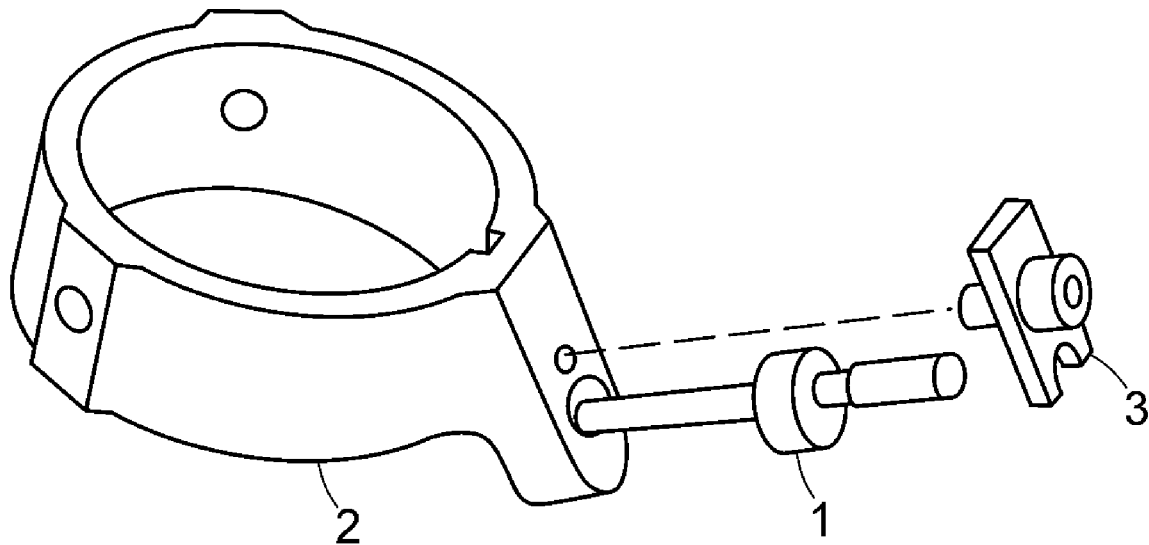
Figure 6E:
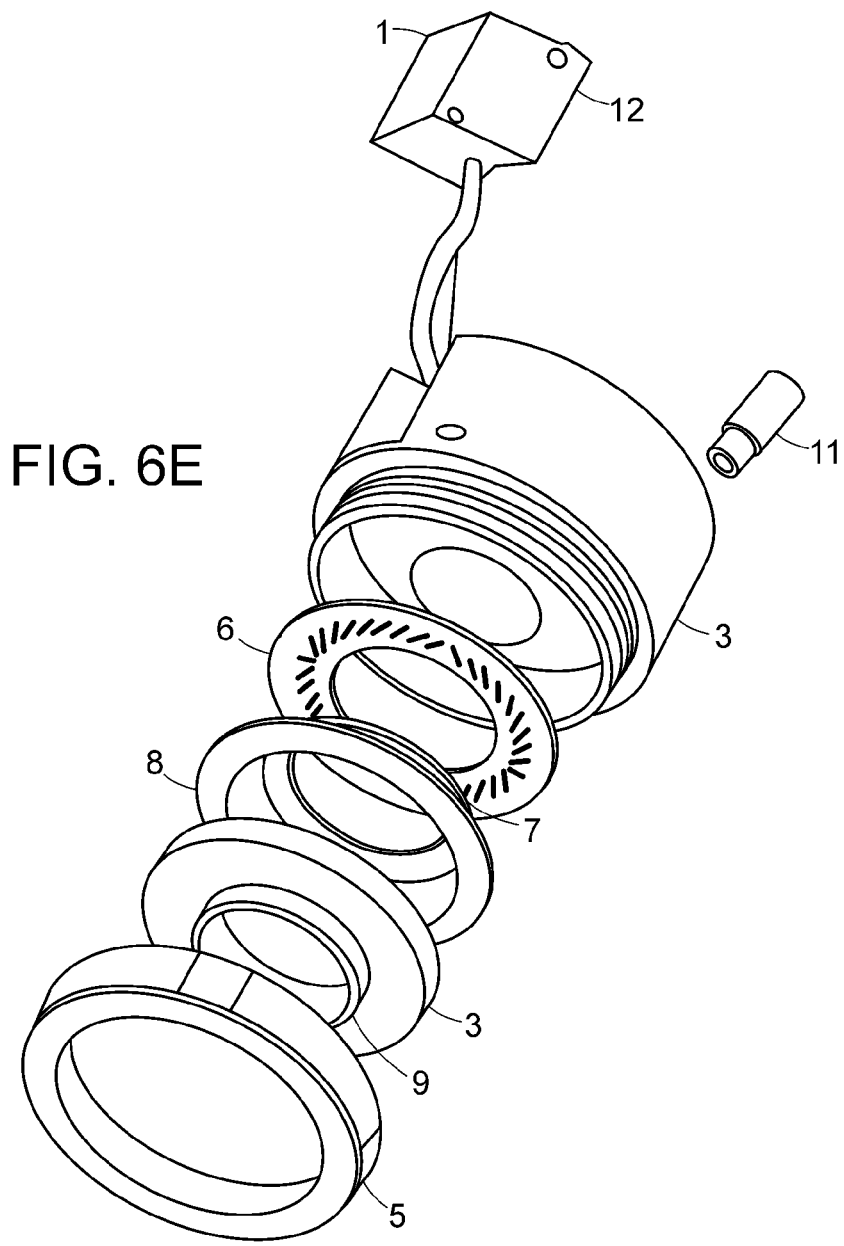

Referring in detail to FIGS. 3G and 3H, a concave feed blade performs best because the dish shaped surface helps to contain the flow to the feed blade causing all of the liquid to flow directly to the atomizing surface. The concave feed blade eliminates spurious liquid flow and therefore facilitates a coating pattern with well defined edges.

The present invention comprises an ultrasonic spray coating system having a converter mechanism for converting high frequency electrical energy into high frequency mechanical energy to thereby produce vibrations. The converter mechanism is designed to have one resonant frequency. A spray head is coupled to the converter mechanism and is resonant at the same resonant frequency. The spray head has a spray forming tip and concentrates the vibrations of the converter at the spray forming tip. The spray forming tip has a feed blade and an atomizing surface. The spray forming tip concentrates a surface wave on the feed blade and a displacement wave on the atomizing surface from the vibrations of the converter. A high frequency alternating mechanism is electrically connected to the converter mechanism to produce a controllable level of electrical energy at the proper operating frequency of the spray head/converter mechanism such that the spray forming tip is vibrated ultrasonically with a surface wave concentrated on the feed blade and a displacement wave concentrated on the atomizing surface.

As shown in FIG. 3H, a liquid supplier is provided having a liquid applicator in close proximity with the feed blade of the spray forming tip and spaced therefrom. The liquid applicator includes an output surface having an orifice therein. The output surface is in close proximity with the feed blade of the spray forming tip and spaced therefrom. The output surface of the liquid applicator and the feed blade of the spray forming tip are at substantially right angles to each other such that liquid supplied from the liquid applicator forms a bead or meniscus between the output orifice of the liquid applicator and the feed blade of the spray forming tip. The meniscus is formed and sustained by the flow of liquid from the output orifice of the liquid applicator and the ultrasonic surface wave that exists on the feed blade of the spray forming tip. The ultrasonic surface wave enables the liquid to 'wet-out' and adhere to the feed blade of the spray forming tip. The surface tension of the liquid allows the meniscus to form and constant flow of liquid sustains the meniscus. The longitudinal displacement wave (that displaces the atomizing surface) pumps the liquid from the feed blade to the atomizing surface located on the end of the spray forming tip. The opposite side of the spray forming tip is the air impingement surface. A film of liquid then forms on the atomizing surface and that liquid is transformed into small drops and propelled from the atomizing surface by air directed against the impingement surface, thereby forming a rectilinear spray. A controllable gas entrainment mechanism is associated with the spray head for affecting and controlling the velocity and pattern of the resultant spray.

Integrated Fluid Delivery System (IFDS)

Referring in detail to FIGS. 4, 5 and 6, the IFDS provides the liquid delivery means and air delivery means to facilitate a narrow, well defined spray pattern on a substrate. The IFDS: 1) provides the means to apply a flowing liquid to the feed blade of the spray head and 2) provides a directed air stream in the direction of the atomized coating to "focus" the resulting spray pattern onto a substrate. The IFDS is sized to fit the nominal diameter of the spray head. Referring in detail to FIGS. 5A-5G, an IFDS consists of nine components:

(1) Liquid Applicator
(2) Fluids Applicator Body
(3) Air Shaping Ring
(4) Air Shaping Ring Retainer
(5) Air Diffuser
(6) Inner Gasket
(7) Outer Gasket
(8) Air Shroud
(9) Air Inlet First, the Liquid Applicator attaches through a cutout feature in the side of the Applicator Body Second, the Air Diffuser mounts concentrically to a seating surface in the bottom of the Applicator Body. A "disk shaped" annulus is formed between the applicator body and the air diffuser disk. Next, the Inner and Outer Gaskets mount concentrically to seating surfaces on top of the Air Diffuser. Then, the Air Shaping Ring mounts against the Inner and Outer Gasket's surface. A "disk shaped" air passageway is formed between the Air Diffuser and Air Shaping Ring with spacing equal to the thickness of the gaskets. After that, the Air Shroud is pressed into the Air Shaping Ring. Last, the Air Shaping Ring retainer is threaded to the bottom of the Applicator Body pushing the Air Shaping Ring against the gaskets to form a sealed air passageway.

Air flows from the Air Inlet to the annulus in the Applicator Body, through the diffuser into the air passageway formed by the gaskets and inside surface of the Air Shaping Ring out through the holes in the Air Shaping Ring. The Air Diffuser evenly distributes the air to the holes in the Air Shaping Ring from the air supply port in the Applicator Body. The Air Shroud prevents the air curtain from curling inward towards the spray forming tip and interfering with the ultrasonic atomizing process. The resulting air curtain entrains and focuses the ultrasonically produced spray without mixing with it, thus controlling the shape of the coating pattern.

The Air Shaping Ring is used to control the 1) width of the spray pattern, 2) quality of the edges of the coating pattern and 3) to facilitate high quality coating patterns at a distance of more than 20 mm from the substrate. Control over coating width is important to facilitate coating patterns as small as 1 mm (e.g., applying liquid solder flux to solder balls on a semiconductor package) up to 20 mm (e.g., applying conformal coating between components on a printed circuit assembly).

Controlling the quality of the coating edges is important to minimize coating going onto areas where it is not wanted. Applying the coating from at least 20 mm away from the substrate is important to avoid objects protruding from the substrate (i.e., avoiding circuit components on a printed circuit assembly).

Referring in detail to FIGS. 4A-4D, the Air Shaping Ring delivers a conically shaped air curtain to entrain the atomized liquid flowing from the Spray Forming Tip to create a well-defined coating pattern on a substrate. The width of the spray pattern "w" is determined by the angle (θ) of the air passageway holes the Air Shaping Ring. In general, when θ is zero the spray pattern is widest and there is minimal control over the quality of the edges of the coating. This is because the air curtain does not intersect with the column of atomized coating. It has been found through experimentation the θ must be between 5 degrees and 15 degrees, depending on the diameter of the hole pattern in the Air Shaping Ring, for optimal coating pattern quality.

Referring to FIGS. 5A-5G, the Liquid Applicator is comprised of 1) a liquid applicator block 12 and 2) a liquid applicator feed tube 13. The liquid applicator block contains a liquid inlet port 14, a liquid passageway and outlet port 15. The liquid inlet port is a threaded port that will accept the liquid supply tube. The liquid passageway is a concentric hole that in turn connects to an outlet port. The outlet port provides the mounting means for the liquid applicator feed tube. The liquid applicator feed tube is formed from stainless steel hypodermic tubing and has a straight portion that is the inlet end has a bent portion that is the outlet end. The outlet end of the liquid feed tube is the liquid output surface from which liquid is delivered to the spray forming tip. The inlet end of the liquid applicator feed tube is connected coaxially to the outlet port of the liquid applicator block. The Liquid Applicator is mounted to the Applicator Body such that the inlet port and outlet port are at a 22 degree angle with respect to the centerline of the Applicator Body and so that the outlet end of the feed tube is at a 90 degree angle to the centerline of the Applicator Body. The Liquid Applicator is detachable from the Applicator Body for maintenance purposes. The liquid applicator is constructed from stainless steel or engineering thermoplastic such as PPS or PEEK.

As shown in FIGS. 5C and 5D, the Applicator Body has an outside diameter (OD) and an inside diameter (ID) and a height (h). The inside diameter provides clearance for the spray head and ranges from 6 mm to 10 mm. The outside diameter is a small as practical but large enough to contain the air passageways for the Air Shaping Ring and cutout feature for the Liquid Applicator. The outside diameter ranges from 17.5 mm to 25 mm. The height of the Applicator Body is 14.5 mm. The applicator body has a top surface and a bottom surface that are parallel to each other and perpendicular to the OD and ID. The top surface has two chamfered features that are opposite each other about the centerline axis; the first chamfer starts at the centerline and is cut at a 9 degree angle to the OD of the part, the second chamfer is offset from the centerline and is cut at a 22 degree angle to the OD of the part, 180 degrees opposite the first chamfer. The first chamfer provides a surface for the air inlet port. The second chamfer is to match the angle of the Applicator Block inlet port surface.

The Applicator Body has an air inlet port connected to an air passageway. The air inlet port is perpendicular to the first chamfered surface in the top of the Applicator Body and connects coaxially with an air passageway that goes through to the bottom surface of the Applicator Body.

The Applicator Body has a cutout pocket feature to hold the Liquid Applicator. This feature starts from the top surface and OD of the part and goes 10 mm from the top surface into the applicator body and intersects the ID. The width of the cutout matches the width of the Liquid Applicator and is centered on the centerline of the part, 180 degrees opposite the air inlet port.

The bottom surface of the Applicator Body has an air annulus, seating surfaces for the Air Diffuser, Inner and Outer Gaskets and Air Shaping Ring and a threaded feature that the Air Shaping Ring retainer threads onto. The threads are cut into the OD of the Applicator Body over a 3 mm length from the bottom surface. A seating surface is bored into the part to a 2 mm depth from the bottom surface. An annulus for air is cut into the seating surface 3 mm wide and 1 mm deep such that the air passageway intersects the center of the annulus.

The Air Diffuser distributes the air flowing from one relatively large air supply port in the Applicator Body over many smaller holes to provide an even flow distribution to the air ports in the Air Shaping Ring. The Air Diffuser is a thin disk (0.076 mm thick) with an OD and ID such that it mounts concentric to the ID of the Applicator Body and against the seating surface. The diffuser is made up of one hundred and eight (108) holes arranged in an array of three concentric rings. The inner and outer diameters of the array of holes match the annulus in the Applicator Body so that the array of holes is aligned to the annulus. Each ring has thirty six holes evenly spaced over the diameter. The each hole in each ring is offset by 5 degrees to the hole in the adjacent ring. The effective area of the array of holes should be twice the area of the air supply hole in the Applicator Body.

The Inner and Outer Gaskets provide an air tight seal between the Air Diffuser and the inside surface of the Air Shaping Ring. The annulus between the gaskets and the Air Shaping Ring form the air passageway that supplies air to the holes in the Air Shaping Ring. The gaskets are constructed of a rubber-like material such as a perfluoroelastomer for maximum chemical resistance. The gaskets are 0.75 mm thick. The ID of the inner gasket matches the ID of the Applicator Body and the OD of the Inner Gasket matches the OD of the air annulus. The OD of the Outer Gasket matches the diameter of the seating surface bore and the ID of the Outer Gasket matches the OD of the air annulus.

The Air Shaping Ring is a disk that has an inlet side and an outlet side and is 2 mm thick. The OD of the ring matches the OD bore of the seating surface in the Applicator Body. The ID of the ring matches the ID of the seating surface bore. The inlet side has an air annulus that is 0.25 mm deep and that matches the annulus formed by the inner and outer gaskets. An array of between six (6) and twelve (12) through holes is machined in the annulus at an angle between 5 and 15 degrees with respect to the longitudinal axis of the ring. The diameters of the holes are the same and range from 0.3 mm to 0.5 mm. A counter bore is formed into the outlet side of the Air Shaping Ring to accept the Air Shroud. The Air Shaping Ring is constructed from either stainless steel or an engineering thermoplastic that is chemically resistant, such as PPS or PEEK.

The Air Shroud is a cylindrical shaped device that shields the atomization process on the spray forming tip from the air issuing from the Air Shaping Ring. Without the Air Shroud atomized coating is pulled back into the IFDS by the Air Shaping Ring air causing coating material to build up in the IFDS and drip off. Coating material dripping from the IFDS causes defects in the spray pattern and also causes coating to be deposited in unwanted areas. It has been found through experimentation that the Air Shroud should protrude from the outlet surface of the Air Shaping Ring 1.6 mm.

Liquid Applicator

FIGS. 6A-6E illustrate additional details of the liquid applicator and air director assembly. As shown in FIG. 6A, the device includes the following components:

1 liquid applicator
2 air director assembly
3 fluids applicator body
4 air shaping ring
5 air shaping ring retainer
6 air diffuser
7 inner gasket
8 outer gasket
9 air shroud
11 air inlet
12 liquid applicator block
13 liquid feed tube
14 liquid inlet port
15 wide mode air director inlet port
16 wide mode air deflector tube
17 liquid outlet port FIGS. 6B, 6C and 6D show additional details. FIG. 6B shows the liquid supply tube, the ring air supply tube, the air director supply tube, the air director wide mode position, the liquid applicator output surface, the feed blade, the impingement surface and the atomizing surface of the spray tip. FIG. 6C shows the air director assembly (1) and the fluids applicator assembly (2). FIG. 6D shows the air director tube (1), the air director (2) and the air director clamp (3).

FIG. 6E shows the following component parts in and exploded view:

1 liquid applicator
3 fluids applicator body
4 air shaping ring
5 air shaping ring
6 air diffuser
7 inner gasket
8 outer gasket
9 air shroud
11 air inlet
12 liquid applicator block Ultrasonic Generator Description A voltage generator drives the spray head at the proper ultrasonic operating frequency. The circuitry is designed to include the spray head in the frequency control path and to adjust power according to system demand. The operating frequency ($f_o$) generated is between the resonant frequency ($f_r$) and the anti-resonant frequency ($f_a$) of the spray head—as shown in FIG. 13, such that a proper ultrasonic wave system is established in the spray forming tip. The ultrasonic generator is designed to generate and maintain the required operating frequency during changing environments such as ambient temperature. Additionally, the amplitude of the ultrasonic output from the generator is adjustable to accommodate the flow rate requirements of various situations.

The power generator features a unique full bridge power output circuit configuration with a frequency driven pulse mode driver. The high frequency alternating voltage generator utilizes MOSFET power transistors in a bridge type, transformer-coupled configuration (no shown) to provide power to the ultrasonic converter. The DC supply voltage to the bridge circuit is varied to control the level of voltage delivered to the ultrasonic converter.

Pulsed Liquid Delivery

A precision liquid delivery system controls liquid flow to the spray forming tip. The liquid delivery system consists of a high-speed miniature solenoid valve and a high-speed driver circuit. The valve is commercially available from The Lee Company, USA. The solenoid valve is chemically inert, has a response time of less than 0.25 milliseconds and operates at speeds up to 1200 Hz. The valve has an open flow capacity, with water, of 20 cc/min at 20-PSI pressure.

Referring in detail to FIG. 7, the dispense volume per pulse is determined by the ON time (Ton) of the valve and the type fluid dispensed. The effective flow rate is calculated by multiplying the number of pulses per second (or operating frequency) of the valve. The ON time of the valve can be varied between 0.2 milliseconds and 0.5 milliseconds. The operating frequency of the valve can be varied from 10 Hz to 1200 Hz.

This system can accurately control flow from 0.5 μLiters/second to 800 μLiters/second (based on water at standard temperature and pressure).

Figure 8:
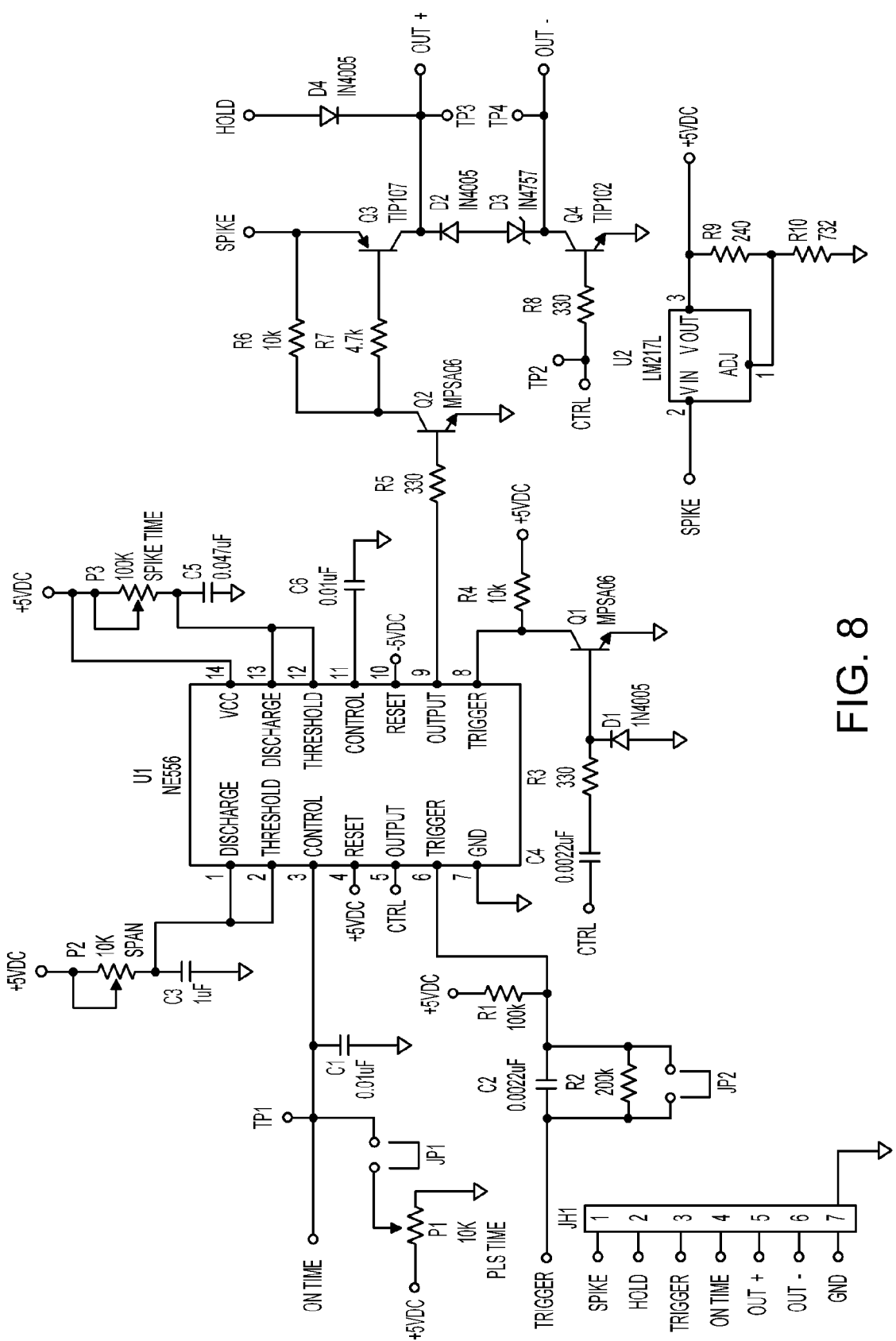
FIG. 8 is a circuit diagram of the high-speed driver circuit used to operate the solenoid valve for flow control in the spray head of the present invention.
Figure 9:
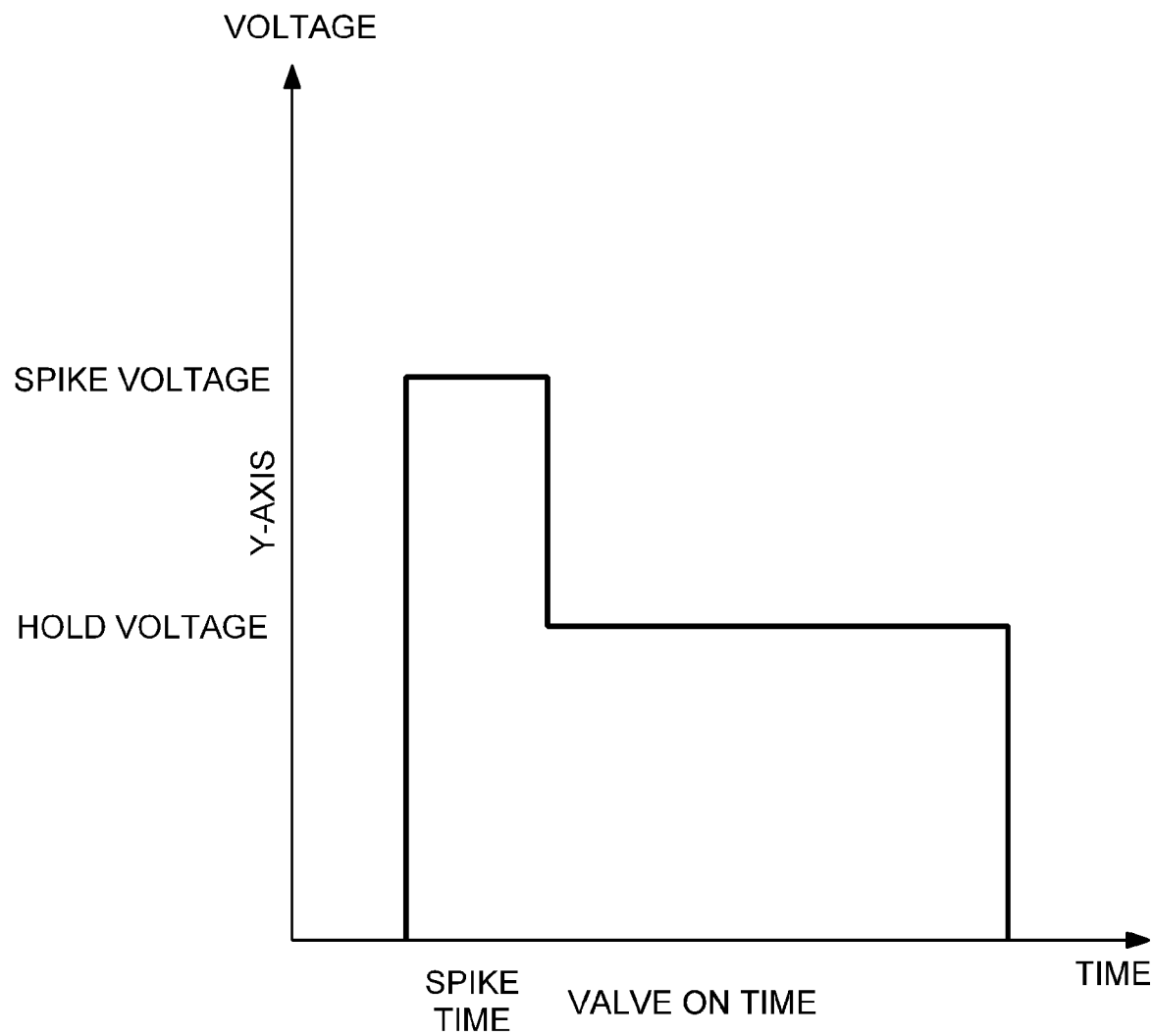
FIG. 9 is a graphic representation of Voltage vs. Valve-on Time illustrating the spike voltage for rapid opening of the solenoid valve and the hold voltage used to keep the valve open as desired.
Figure 10:
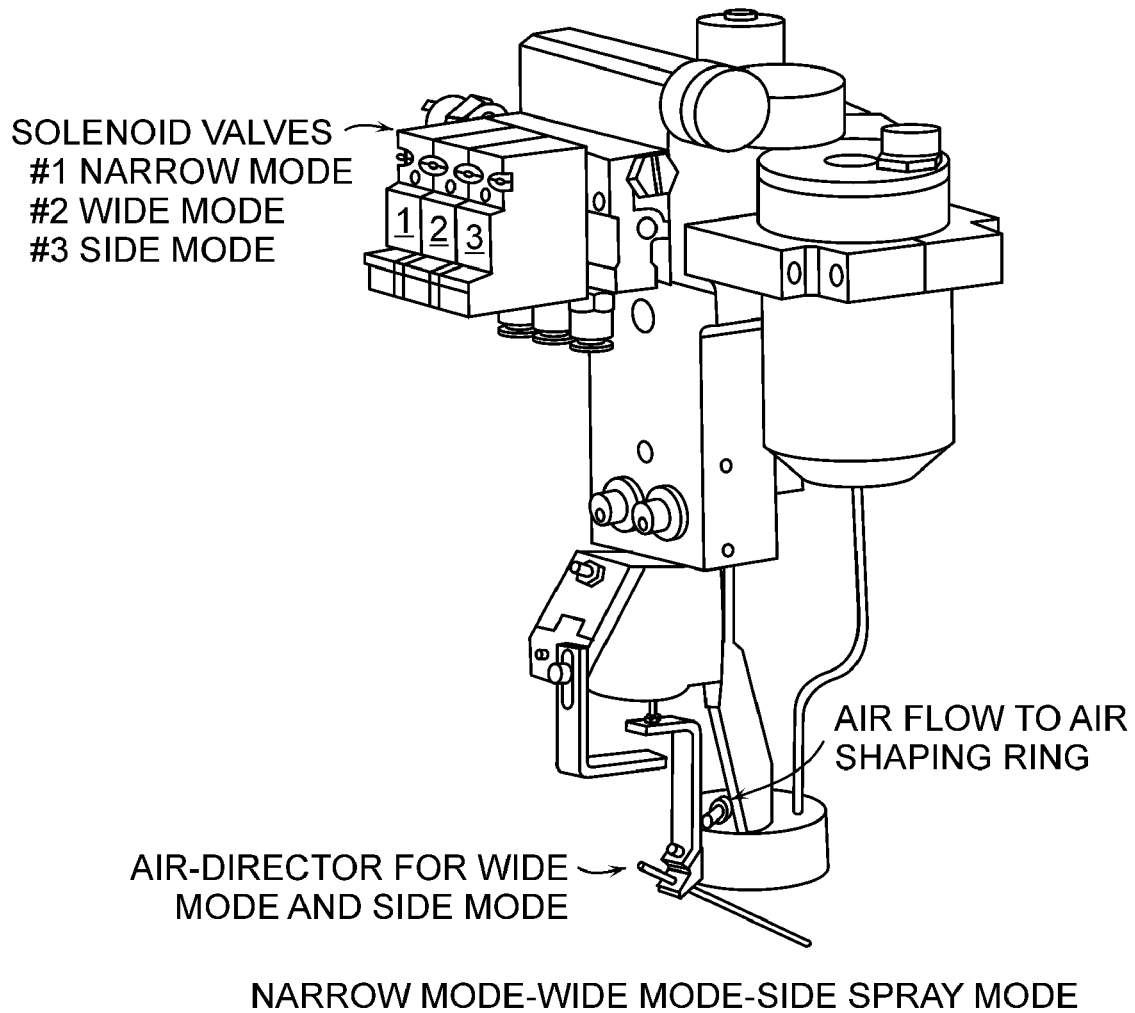
FIG. 10 illustrates the solenoid valve controls (1, 2, 3) used to control the three spray patterns available from the device—narrow mode spray pattern; wide mode spray pattern; and side mode spray pattern.
Figure 11A:
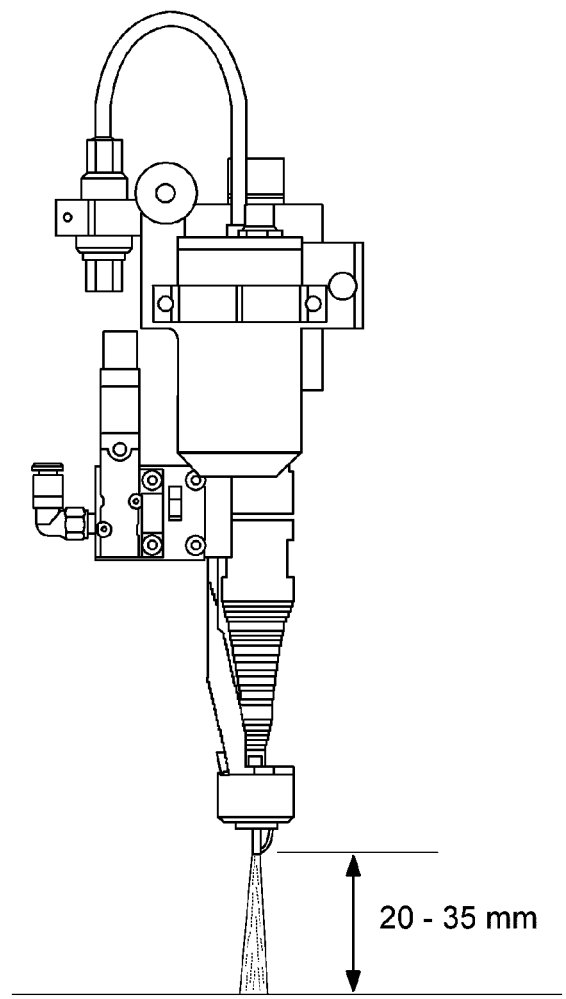
FIG. 11, which has two parts (11A and 11B), illustrates the operation of the spray head of the present invention and shows one example of a precise narrow spray pattern obtained therefrom.
Figure 11B:
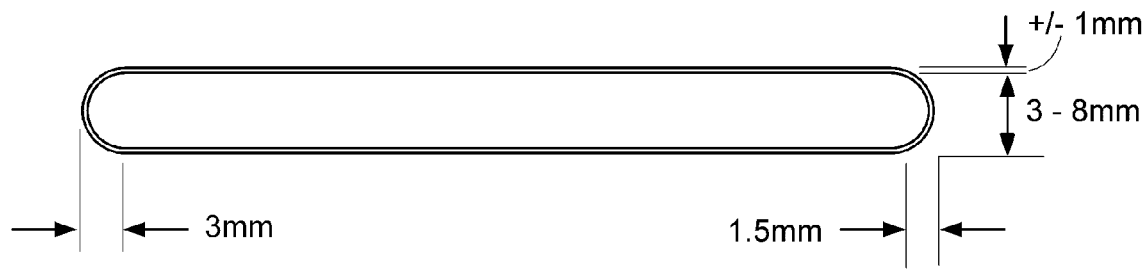
Figure 12:
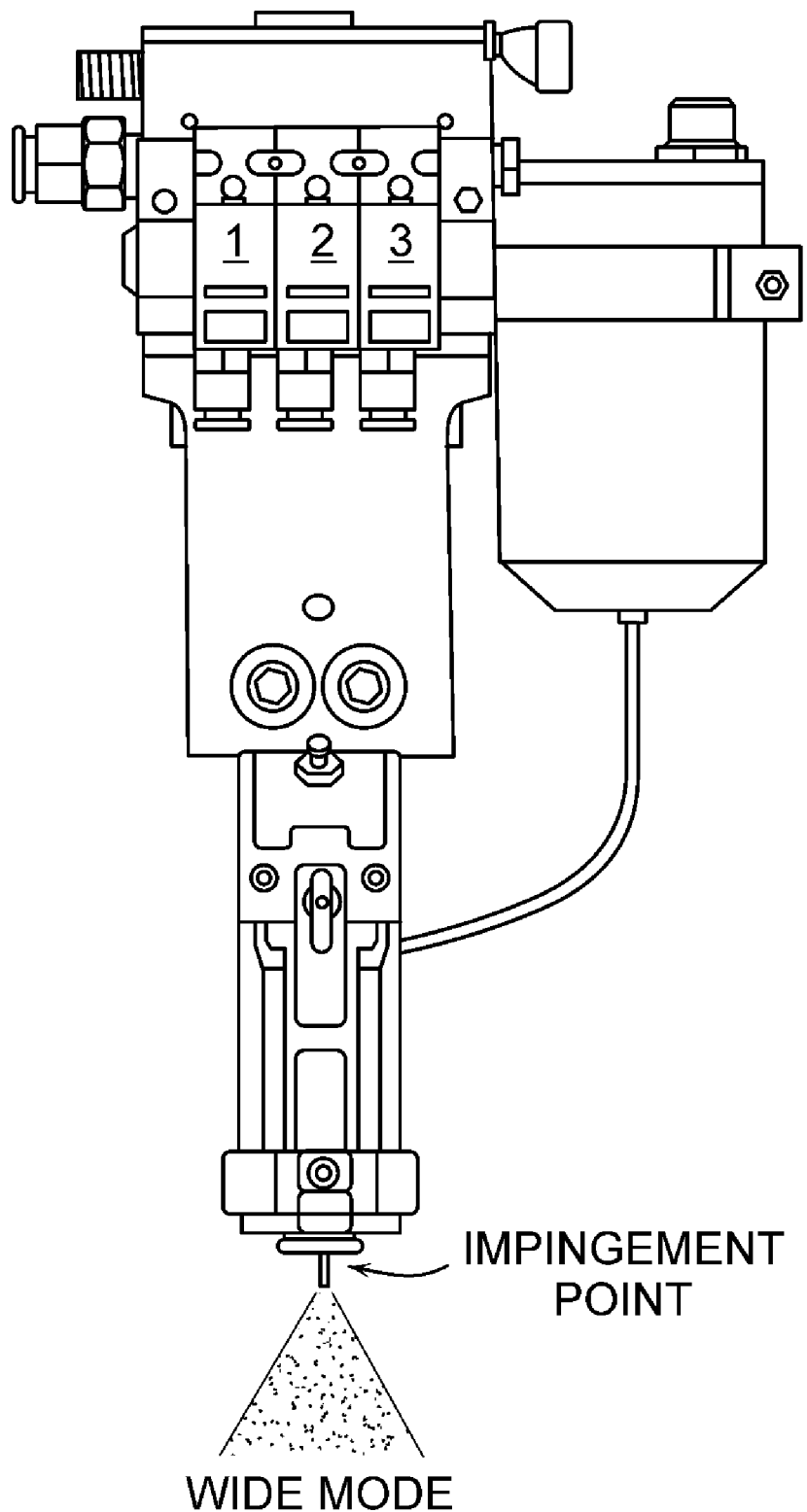
FIG. 12 illustrates the operation of the spray head of the present invention and shows one example of a precise wide mode spray pattern obtained therefrom.
Figure 13:
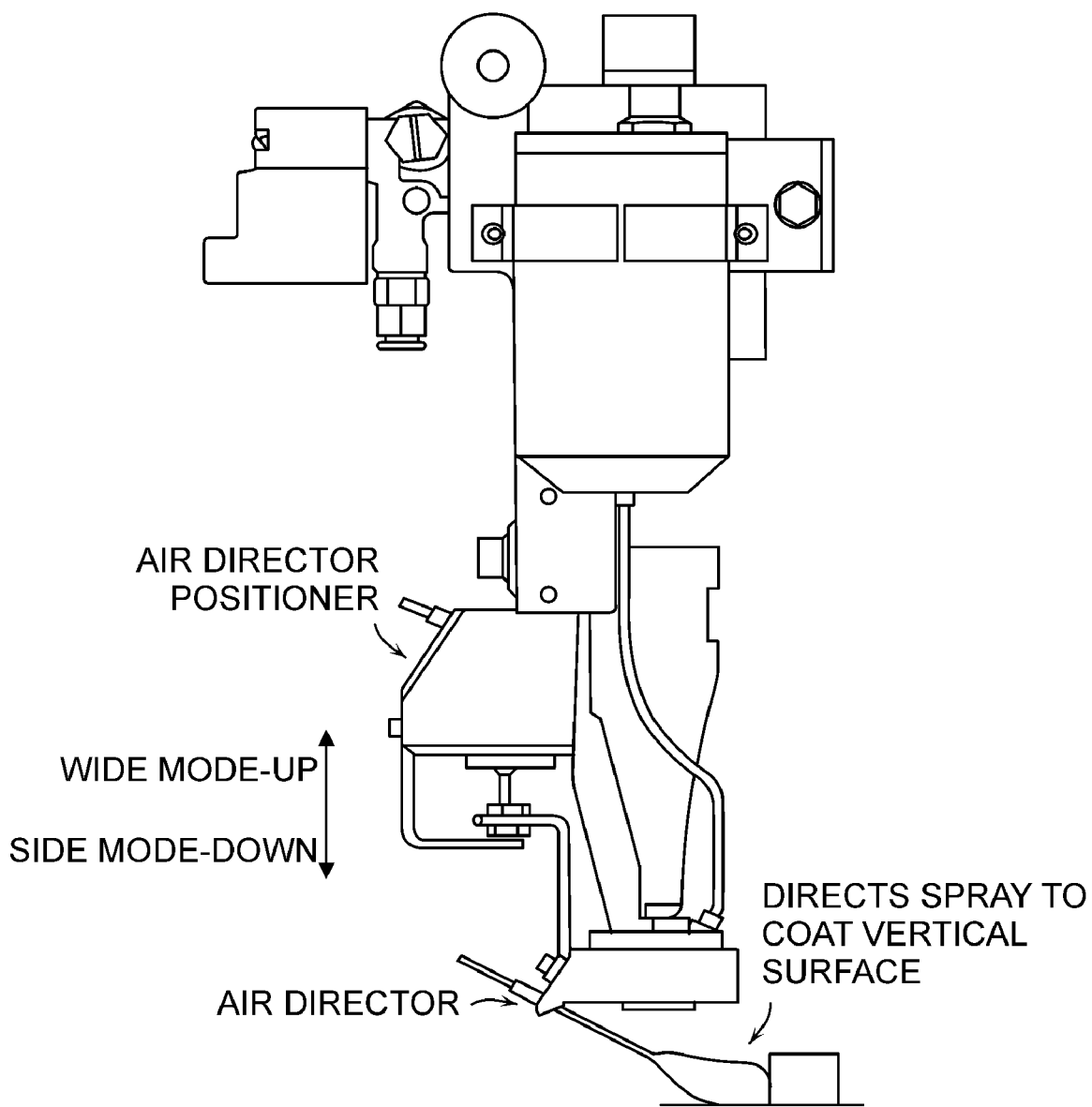
FIG. 13 illustrates the operation of the spray head of the present invention and shows one example of a precise side mode spray pattern obtained therefrom.

Referring in detail to FIGS. 8 and 9, the high-speed driver circuit is used to operate the solenoid valve. This circuit applies a high voltage level to the valve (called the "spike voltage") to quickly open the valve, and then applies a lower voltage (called the "hold" voltage") to keep the valve open. The length of time the spike voltage is applied is set via potentiometer P3. The total time the valve is to be kept open is set either by potentiometer P1, or via a 0-5V signal applied to the "On Time" terminal. The range of time that the valve is held open is set via potentiometer P2. Momentarily switching the "Trigger" terminal to ground via and external controller activates the circuit. The switching time of the external controller set the valve operating frequency.

Thin, precisely defined coating patterns are achievable using the ultrasonic spray system with the precision liquid delivery system.

Coating Segment Shape

FIG. 10 illustrates the three solenoid valves (#1, #2, #3) used to control the spray patterns of the spray head.

Referring in detail to FIG. 11, the ultrasonic spray head with IFDS and precision liquid delivery system produces a coating segment with a shape. The width of the coating segment is proportional to the 1) ID of the liquid feed tube in the IFDS; 2) the liquid flow rate; and 3) the speed of the spray head relative to the substrate. The coating segment width is directly proportional to the ID of the liquid feed tube—the smaller the ID of the liquid feed tube, the narrower the coating segment width. The coating segment width is directly proportional to the liquid flow rate—the lower the flow rate, the narrower the coating segment width. The coating segment width is inversely proportional to the head speed—the faster the speed of the head, the narrower the coating segment width.

The precision liquid delivery system enables accurate control over the shape of a coating segment. Precisely metering the liquid flow to the spray forming tip provides a smooth transition from a flow "off" to a flow "on" condition and vice versa. The rapid on/off metering of the liquid flow eliminates heavy (wide) sections at the beginning and end of spray segments that would normally result if a conventional solenoid valve or pneumatically actuated needle valve were used. Additionally, the precision liquid delivery system allows the liquid flow rate to be changed electronically with the system control software. Thus, the coating thickness and coating segment width can be changed independent of coating head speed providing a more versatile, fully programmable selective coating system.

Referring in detail to FIGS. 11, 12 and 13, in addition to the directed air stream produced by the air-shaping ring described above, the following additional improvements in the spray head have been made:

1) An air director and mounting ring.
2) A pneumatically actuated air director positioner for the air director.
3) Two additional solenoid valves to activate air flow to the air director and to the air director positioner.

These improvements enable the spray head to operate in any one of the following three-modes (or combinations thereof):

1) Narrow mode—where the airflow is directed through the air ring to focus the ultrasonically produced spray (i.e., as described above). See FIG. 11.
2) Wide mode—where the airflow is directed through the air director to expand the ultrasonically produced spray. Impinging the directed air stream on the flat surface of the spray-forming tip expands the spray. The directed air stream is impinged on the opposite surface to the liquid feed surface. See FIG. 12.
3) Side mode—where the air director positioner is actuated, moving the air director to the lower position and airflow is directed through the air director to direct the ultrasonically produced spray at an oblique angle from the spray forming tip. The purpose of directing the spray at an oblique angle is to coat a vertical surface, such as the side of a tall component that would not otherwise be coated if the spray were directed in the normal vertical path. See FIG. 13.

Referring in detail to FIGS. 10-13, the ultrasonic spray head with IFDS, precision liquid delivery system, air director positioner, air director and air director mounting ring produces a coating segment with a shape. When solenoid valve #1 is activated, airflow is directed to the air-shaping ring producing a narrow pattern as described previously. When solenoid valve #2 is activated, airflow is directed through the air director, which impinges the air stream on the flat surface of the spray-forming tip on the opposite side to the liquid feed tube. The impinged air stream expands the ultrasonically produced spray emanating from the spray-forming tip producing a wide pattern up to five times the width of the narrow mode pattern. When solenoid valve #3 is activated the air director positioner is actuated to move the air director to position in which the air stream through the air director (activated by solenoid #2) is directed directly into the ultrasonically produced spray emanating from the spray-forming tip. The resulting spray pattern from the simultaneous activation of solenoid valves #2 and #3 produces a sideways spray in which coating is applied to a vertical surface.

Referring in detail to FIG. 12, solenoid valve #2 is activated, directing the airflow through the air director to impinge upon the side surface of the spray-forming tip. The impinged air expands the ultrasonically produced spray to a width up to five times the narrow mode width (FIG. 11)

Referring in detail to FIG. 13, solenoid vales #2 and #3 are activated, moving the air director to direct the air stream into the ultrasonically produced spray. The spray is directed to the side (vertical) surface of a component.

As described above, the ultrasonic spray head assembly consists of two major components: 1) an ultrasonic converter with spray head and 2) an integrated fluid applicator. This system is constructed in the same manner, and from the same materials, as are the prior art ultrasonic spray systems defined in the patents recited above. The prior art systems are commercially available from Ultrasonic Systems, Inc. of Haverhill, Mass., the assignee of the present invention.

This invention can be used for applying thin, uniform coatings to virtually any substrate. In particular, this device can be used to apply conformal coatings to printed circuit board assemblies, either to cover the entire board assembly or to apply the coating selectively to the board. The advantages that this device provides over conventional spray devices include:

(1) Improved transfer efficiency—over 90% of the sprayed coating is transferred to the board vs. 40% to 60% for air assisted spray nozzles;
(2) Smooth, defect free coatings—since the primary mechanism for atomization is ultrasonic, the applied coating appears smooth and is free of bubbles and pinholes. Conventional air assisted spray nozzles use compressed air to atomize the coating, which results in a coating that has an "orange peel" like appearance and can have bubbles and pin holes due to the atomizing air pressure. To overcome these "defects" air assisted nozzle coatings are applied in higher volume resulting in a thicker coating—typically between 125 microns to 250 microns.

(3) Thinner coatings—since this device provides a uniform, defect free coating the resulting coating thickness is typically between 10 microns to 250 microns. The thinner, defect free coating applied at a higher transfer efficiency results in coating material savings.

(4) In certain embodiments, finer, more narrow spray patterns—the air shaping ring, as part of the integrated fluid applicator allow the spray pattern to be focused and to allow superior "edge definition" at a greater distance from the substrate allowing for greater flexibility in positioning the spray device for selectively coating a populated circuit board.

(5) More precise control over coating deposition—since the liquid is applied externally to the vibrating spray forming tip, precise amounts of liquid can be applied to the tip and dispersed as a spray to the substrate providing precise coating deposition control.

This device can also be used to apply proprietary liquid coatings to green tape used in the production of fuel cells. Other applications include applying: "micro volume" liquid coatings to semiconductors devices (e.g., flux to solder balls (C4 technology) for flip chips), polymer coatings (drug coatings) for stents, conductive inks on ceramic substrates and many more. Many of the advantages listed above over existing spray nozzle technology are applicable to these applications.

This device will typically be attached to an end effector that is part of an X, Y, Z programmable robot that controls the position and speed of the device relative to the substrate, thereby, allowing the user to apply coatings of any desired pattern to the substrate.

The present invention has been described in detail, including the preferred embodiments thereof. However, it will be appreciated that those skilled in the art, upon consideration of the present disclosure, may make modifications and/or improvements on this invention and still be within the scope of this invention as set forth in the following claims.

What is claimed is:

1. An ultrasonic spray coating system comprising an ultrasonic generator connected to an ultrasonic spray head, with air and liquid supply passage ways, and an ultrasonic power generator;
    wherein a coating liquid is applied externally to a feed blade located at the spray forming tip of the spray head by an integrated fluid delivery means;
    wherein the liquid is then pumped by an ultrasonic surface wave formed on the feed blade to the atomizing surface of the spray-forming tip where it is atomized by an ultrasonic compression wave;
    wherein the resulting spray has a flat sheet-like pattern; and
    wherein the process parameters for the spray head with the integrated fluid delivery system are controlled electronically, including liquid flow rate, air pressure, spray mode, head height and head speed.

2. The ultrasonic spray coating system of claim 1, wherein the coating liquid is stored in a pressurized reservoir and fed to the liquid applicator by a precision liquid delivery system.

3. The ultrasonic spray coating system of claim 1, wherein the ultrasonic vibrations of the spray forming tip break up the liquid into small droplets and propel them from the tip in the form of a spray, and wherein the width of the spray pattern produced is equal to the width of the spray forming tip.

4. The ultrasonic spray coating system of claim 1, wherein one or more air directors are used to produce one of three spray patterns, based upon the nature and placement of the air stream—narrow mode spray pattern; wide mode spray pattern; or side mode spray pattern.

5. The ultrasonic spray coating system of claim 4, wherein an air shaping ring is used as an air deflector to form a narrow mode spray pattern.

6. The ultrasonic spray coating system of claim 4, wherein an air director is used to produce the wide mode spray pattern.

7. The ultrasonic spray coating system of claim 6, wherein the air director impinges a jet of air on the tip of the spray head opposite the liquid feed side, such that the resulting airflow entrains and expands the ultrasonically produced spray to form a flat rectilinear pattern up to five times the width of the pattern produced by in the narrow mode.

8. The ultrasonic spray coating system of claim 4, wherein an air director is used to produce the side mode spray pattern operation of the spray head;
    such that the air director impinges a jet of air on the tip of the spray head opposite the liquid feed side, and the spray head tip is offset to the side of the substrate so that the spray is directed to coat a vertical side of a substrate.

9. The ultrasonic spray coating system of claim 1, wherein the spray is produced with a transfer efficiency in the range of 95 to 99 percent.

10. The ultrasonic spray coating system of claim 1, wherein the coating liquid is delivered to the spray forming tip on the ultrasonic transducer from an external liquid applicator.

11. The ultrasonic spray coating system of claim 1, wherein the system is capable of spraying one or more liquids onto substrates in a pattern about 2 mm to about 5 mm wide at a distance of up to 40 mm from the substrate.

12. The ultrasonic spray coating system of claim 1, wherein the ultrasonic converter transforms high frequency electrical energy into high frequency mechanical energy.

13. The ultrasonic spray coating system of claim 12, wherein the converter has a predetermined resonant frequency.

14. The ultrasonic spray coating system of claim 13, wherein the spray head is coupled to the converter and is resonant at the same resonant frequency of the converter.

15. The ultrasonic spray coating system of claim 1, wherein the integrated fluid applicator further comprises separate passageways for liquid and air.

16. An ultrasonic spray coating system comprising an ultrasonic generator connected to an ultrasonic spray head, with air and liquid supply passage ways, and an ultrasonic power generator;
    wherein a coating liquid is applied externally to a feed blade located at the spray forming tip of the spray head by an integrated fluid delivery means;
    wherein the liquid is then pumped by an ultrasonic surface wave formed on the feed blade to the atomizing surface of the spray-forming tip where it is atomized by an ultrasonic compression wave;
    wherein the resulting spray has a flat sheet-like pattern;
    wherein the integrated fluid applicator further comprises separate passageways for liquid and air and
    wherein the integrated fluid applicator further comprises a liquid output surface, an air annulus and an air-shaping ring.

17. The ultrasonic spray coating system of claim 16, wherein the integrated fluid applicator further comprises separate inlet ports for air and liquid.

18. The ultrasonic spray coating system of claim 17, wherein the air inlet port is connected to a ring shaped annulus.

19. The ultrasonic spray coating system of claim 17, wherein the inlet port for liquid is connected to the output surface of the liquid applicator.

20. The ultrasonic spray coating system of claim 16, wherein the air-shaping ring attaches to the bottom of the fluid applicator to enclose the air annulus to form an air passageway to supply air to the holes in the air-shaping ring.

21. The ultrasonic spray coating system of claim 1, wherein one or more air directors are used to produce one of three spray patterns, based upon the nature and placement of the air stream—narrow mode spray pattern; wide mode spray pattern; or side mode spray pattern.

22. The ultrasonic spray coating system of claim 16, wherein one or more air directors are used to produce one of three spray patterns, based upon the nature and placement of the air stream—narrow mode spray pattern; wide mode spray pattern; or side mode spray pattern.

* * * * *